United States Patent [19]

Boling et al.

[11] 4,186,033
[45] Jan. 29, 1980

[54] STRUCTURE FOR CONVERSION OF SOLAR RADIATION TO ELECTRICITY AND HEAT

[75] Inventors: Norman L. Boling; Charles F. Rapp, both of Toledo, Ohio

[73] Assignee: Owens-Illinois, Inc., Toledo, Ohio

[21] Appl. No.: 956,561

[22] Filed: Nov. 1, 1978

[51] Int. Cl.$^2$ .......................... H01L 31/04; F24J 3/02
[52] U.S. Cl. .......................... 136/89 FC; 136/89 HY; 126/441; 126/432
[58] Field of Search .................. 136/89 FC, 89 HY; 126/270, 271

[56] References Cited

U.S. PATENT DOCUMENTS

| | | | |
|---|---|---|---|
| 3,972,317 | 8/1976 | Gallagher | 126/271 |
| 3,987,784 | 10/1976 | Godrick | 126/271 |
| 4,130,445 | 12/1978 | Blieden | 136/89 PC |

OTHER PUBLICATIONS

P. B. Mauer et al. "Fluorescent Solar Energy Concentrator," *Research Disclosure,* pp. 43–44, Oct. 1977.

*Primary Examiner*—Aaron Weisstuch
*Attorney, Agent, or Firm*—Charles S. Lynch; M. E. Click; D. H. Wilson

[57] ABSTRACT

Disclosed is a modified flat plate thermal collector, modified to substitute for one of its insulating flat light conducting members a flat luminescent solar collector plate coupled to a photocell and having a thin layer containing a luminescent species responsive to solar radiation, to provide a structure for producing both electrical and thermal energy, wherein said thin layer is protected from the ambient atmosphere and wherein the thin layer is out of contact with said photocell.

14 Claims, 12 Drawing Figures

STRUCTURE FOR CONVERSION OF SOLAR RADIATION TO ELECTRICITY AND HEAT

This invention concerns solar thermal collectors. This invention also concerns apparatus for converting solar radiation to electricity by means of photovoltaic cells. Such cells actually utilize a very small portion of the solar energy incident thereon to produce electricity. Some of the factors leading to this low efficiency include the fact that photocells are not responsive to all of the sunlight's wavelengths and also the fact that the presently preferred means to collect and concentrate the sun's rays for delivery to photocells, using luminescent solar collectors to be described hereinafter, normally do not in fact collect or trap about 25 percent of the luminescent radiation created with such collectors for delivery to the photocell.

In view of the foregoing and other factors, we have conceived of a combined apparatus which not only improves some aspects of the state of the art luminescent solar collector-concentrators but which also provides for absorption of light not converted to electricity, and recovery thereof as thermal energy, thus producing both thermal and electrical energy in the same apparatus.

Thus, the present invention concerns the art of exposing semiconductors to sunlight to convert at least a part thereof to electrical energy, but in a setting and an apparatus which results in the conversion to thermal energy of a large portion of the solar radiation not converted to electrical energy.

The usual devices for directly converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that such extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however, there has been conceived a different type of collector and concentrator of radiation to be impinged on a semiconductor photocell. For instance, Weber and Lambe in Applied Optics, Vol. 15, pages 2299-2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way the light from the sun is not only converted to more suitable wavelengths for activation of the photocell but is concentrated since the light received by the large area of the collector escapes only in the small area where the photocell is optically connected to the collector.

Another article, by Levitt and Weber, appearing in Applied Optics, Vol. 16, No. 10, pages 2684-2689, October 1977, should be read with the article first mentioned.

Other publications aiding in the understanding of the luminescent solar collectors include Goetzberger, Applied Physics, 14, 123-139, 1977, U.S. Pat. No. 4,110,123 issued Aug. 29, 1978, claiming priority in part based on German patent applications 2620115 published Nov. 10, 1977, filed May 6, 1976 and 2628917 published Jan. 12, 1978, filed June 24, 1976, and, referred to in the former patent application, German patent application No. 2554226, published June 8, 1977, which is of some peripheral interest.

Also, numerous patents deal with the conversion of solar energy to different wavelengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

The present invention utilizes luminescent solar collectors and concentrators which are in a general way of the type disclosed in the Goetzberger et al. publication, U.S. Pat. No. 4,110,123 and German application 2620115, in the Weber and Lambe paper and in the Levitt and Weber paper, but of an improved structure conceived by one of us, a structure similar to that disclosed in Research Disclosure, October 1977 issue, pages 43-44, disclosed by Paul B. Mauer et al., published by Industrial Opportunities Ltd., Homewell, Havant, Hampshire, England.

U.S. Pat. No. 4,081,289 shows a scheme for cooling solar cells as they generate electricity but in a very different setting than the present invention.

Further, it is noted that the Goetzberger et al. paper discloses a hybrid thermal-photovoltaic system involving a luminescent solar collector, although of a construction not similar to that of the present invention.

The concept and structure of a luminescent solar collector coupled to at least one photovoltaic cell, of the general type described hereinbefore, but having a light conducting medium of two or more homogeneous, continuous layers physically and optically coupled to one another, wherein said light conducting medium is optically and physically coupled to a photocell, is described in a paper entitled "Luminescent Solar Concentrator" by C. F. Rapp and N. L. Boling presented before the XIII IEEE Photovoltaic Specialists Conference, June 5-8, 1978 in Washington, D.C. at the Americana Hotel, published Sept. 1, 1978 on pp. 690-93 of the "Conference Record, Thirteenth Photovoltaic Specialists Conference 1978", Institute of Electrical and Electronic Engineers, New York, N.Y. See also Optical Spectra, April 1978, under heading "Industry Briefs." This structure or the similar one disclosed by Mauer et al., noted above is utilized in a novel manner in the present invention as an element in the apparatus of the present invention. One of the layers is relatively thin and is an organic plastic containing a luminescent species such as an organic fluorescent dye. Such organic materials are subject to long term deterioration from the atmosphere, including pollutants in the air. In the operation of the luminescent solar collector, light of one wavelength is absorbed and longer wavelength light is emitted.

It is an object of the present invention to provide a structure for the simultaneous conversion of solar energy to electricity and to thermal energy.

Other objects of the invention include various arrangements for keeping the thin luminescent solar collector film or layer out of contact with the ambient surroundings or with the photocells, which can become very elevated in temperature, as well as advantageous arrangements for recovering heat and for cooling the photocells.

Other objects, as well as aspects and advantages, of the invention will become apparent from a study of the accompanying disclosure and the claims.

Flat panel solar heating units to collect radiant energy from the sun comprise a flat plate such as a metal plate, usually coated on its upper surface with a radiant energy absorbing coating to absorb and convert radiant energy to heat. Above this flat plate, here called a thermal collector plate, are usually one to two "dead air" spaces, defined by one or two light conducting plates (usually glass) disposed essentially parallel to the thermal collector plate in spaced-apart relationship, whose purpose is to prevent the uncontrolled escape of heat energy collected. Examples of such structures are those of U.S. Pat. Nos. 3,972,317 (one or two "dead air" spaces) are 3,987,784 (one "dead air" space). Of course, the bottom of the thermal collector plate is also insulated in one way or another.

The setting for the present invention is a flat solar collector of extended surface for collecting and absorbing solar radiation and conversion of said radiation to heat, of a structure having (1) a flat thermal collector plate with an extended upper surface that has a high absorptivity, at least 0.8, for electromagnetic radiation of wave lengths of 0.3 to 2.1 microns and converts such radiation on absorption largely to heat and (2) one or two superimposed enclosed insulating spaces above said plate, each space being defined by a light conducting plate, the whole being sealed or enclosed about the periphery to form one or two spaces above said thermal plate isolated from the ambient atmosphere. The upper surface of the thermal collector plate advantageously is selective in that it has an emissivity of 0.2 or less for wave lengths of 2–15 microns. It should also be noted that the bottom of the thermal collector plate is also insulated to avoid uncontrolled loss of heat to the surroundings. Insulation of the bottom is usually in the form of an insulating solid such as a plastic or a plastic foam, or in the form of an enclosed space, which is usually a "dead air" space. Very often, in fact usually, the heat is recovered by conduction, direct or indirect, from the bottom of the plate to a heat transfer fluid.

In any event the present invention comprises an improvement in the above apparatus wherein the light conducting plate immediately above the thermal collector plate is a luminescent solar collector and concentrator comprising a radiation collection medium for receiving incident solar radiation, wherein said radiation collection medium is a composite structure comprising: (a) a thin layer, containing at least one luminescent species capable of emitting luminescent radiation upon excitation with incident solar radiation, optically and physically coupled to (b) a relatively thick radiation conducting layer having an index of refraction close to that of said thin layer; and wherein the radiation collection medium is: (i) totally internally reflective of a major portion of said emitted luminescent radiation, (ii) transparent to a portion of said incident solar radiation including visible wavelengths and (iii) optically coupled, in a relatively small portion of the surface area thereof, to a photovoltaic cell responsive to said emitted luminescent radiation, said thin layer containing said luminescent species being within one of said enclosed insulating spaces.

In operation, a portion of the luminescent radiation is conducted to and coupled to the solar cell to produce electricity, and unabsorbed solar radiation including visible wave lengths plus a minor portion of the luminescent radiation is transmitted to the thermal collector plate and largely converted to heat.

In the foregoing structure the thin layer is protected from the ambient environment and from direct contact with said solar cell. If the solar cell were in direct contact with the thin dye-containing layer it could undesirably heat the dye and the thin layer tending to accelerate decomposition of the dye or the thin layer host material. This is because the cell receives concentrated light and about 65–70 percent of the light absorbed by the cell is converted to heat instead of light, thus elevating the cell temperature.

It will be understood that the radiation collection medium should have smooth extended surfaces essentially parallel to each other. Rough surfaces, as will be understood would defeat the object of obtaining total internal reflection. For the same reason all layers of such radiation collection medium are of course continuous and uninterrupted and contain no particulates dispersed therein unless such particles have diameters well below the wave length of any electromagnetic radiation utilized to activate the fluorescent species or the solar cells.

As noted, in the present structure the thin luminescent layer or film is always in one of the isolated or insulating spaces. When the thin film or layer (usually an organic plastic containing an organic luminescent species) is on the bottom of the luminescent solar collector plate it is located in the space between the thermal collector plate and the upper thick layer of the luminescent solar collector plate, and is thus protected from the atmosphere and pollutants therein. Such a structure is illustrated schematically in FIGS. 1 and 2. In such structures the solar cell(s) is located on an edge of the luminescent solar collector plate, thereby avoiding direct conductive heating of the thin luminescent film by the solar cell.

Figure 3:
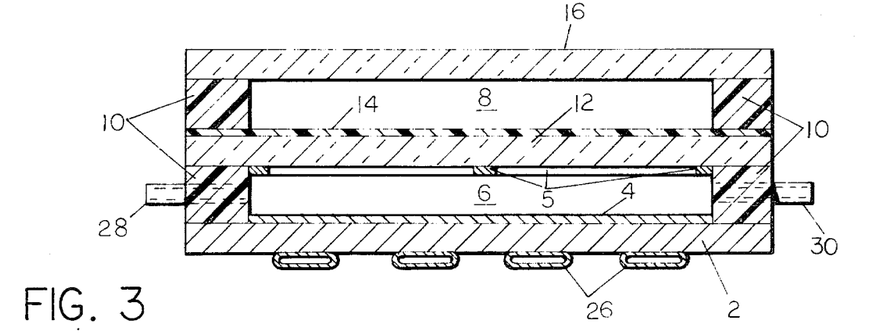
Figure 4:
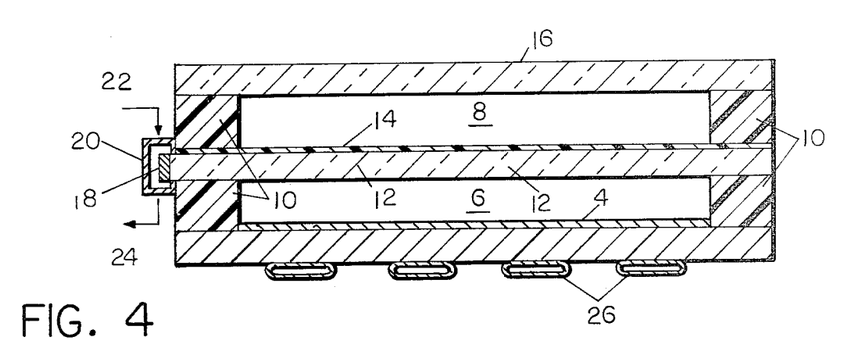
Figure 5:
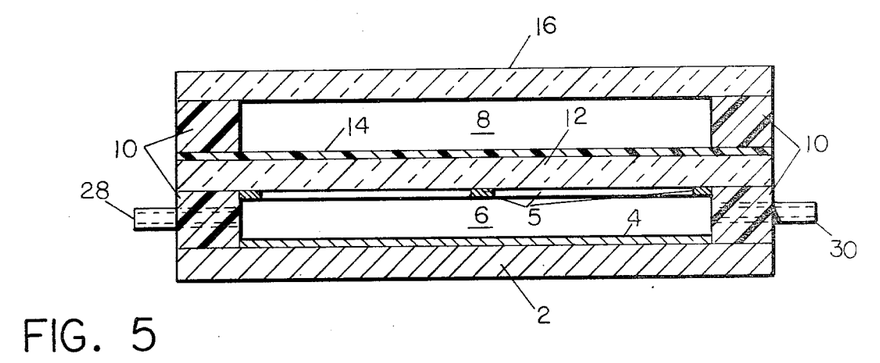
Figure 6:
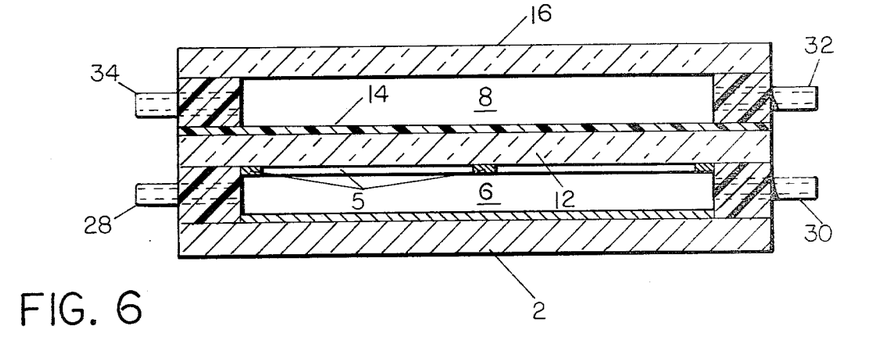

In those instances where the solar heating unit has two light conducting plates stacked in spaced relationship above the thermal collector plate, the luminescent layer such as a thin organic plastic film containing an organic luminescent species can be located on the top of the luminescent solar collector plate and it is thus protected from atmospheric attack in the gaseous insulating space between the two top light conducting plates, as in FIGS. 3, 4, 5 and 6. In FIGS. 3, 5 and 6 a heat transfer gas is circulated between the thermal collector plate and the luminescent solar collector plate, thus recovering useful thermal energy from both the thermal plate and from the solar cells. In FIG. 4 the solar cell is on an edge of the luminescent solar collector and a heat transfer gas is circulated in an enclosed space surrounding the cell and heat is thus recovered from the cell and the cell is cooled, but it is not necessary that a coolant gas be circulated between the thermal collector plate and the luminescent solar collector plate.

Of course, in all embodiments of the present invention the photovoltaic cells are all connected to electrical leads for conducting the electricity produced by the photocell.

The invention in its various embodiments will be better understood in connection with a description of the drawings, of which

FIG. 11 is a partial cross-section of an apparatus of FIG. 2 showing details while

In FIGS. 1-6 the bottom plate 2 shown is the thermal collector plate of the description previously discussed, usually having a selective absorbent coating 4 as also previously discussed. Spaces 6 and 8 are isolated insulating spaces. Insulative spacers 10 are provided between plates and are suitably made of closed cell resilient plastic or rubber-like cellular material. In each Figure, 12/14 is the luminescent solar collector and concentrator plate, and the light-conducting, relatively thin coating 14 of said plate is a plastic layer or other solid containing a luminescent species and is located on the bottom of relatively thick light conducting plate 12 in FIGS. 1 and 2 and on the top of 12 in FIGS. 3-6. In FIGS. 2-6 the top light conducting cover plate is numbered 16 and together with luminescent solar collector plate 12/14 and spacers 10 define isolated insulation space 8.

Figure 1:
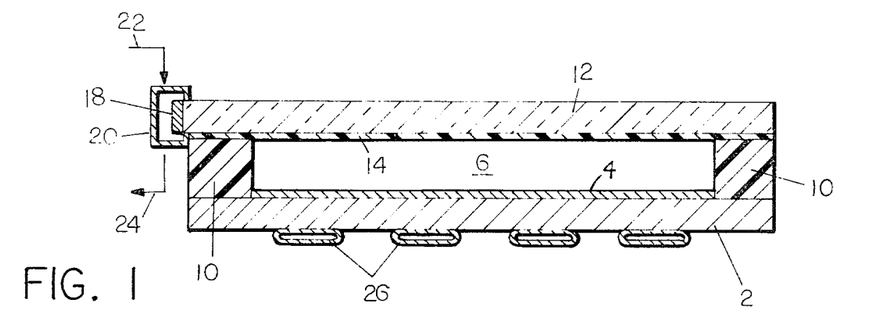
FIGS. 1-6 are simplified or schematic representations of various embodiments of the invention, shown in cross-section.
Figure 2:
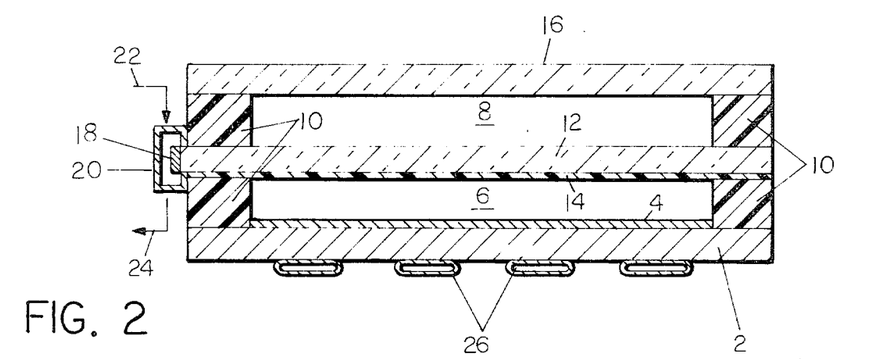

In FIGS. 1, 2 and 4 an elongated photovoltaic cell 18 (such as a silicon photocell) is optically coupled to, and covers, one edge of plate 12/14, while the remaining edges have a highly reflective coating such as an aluminum or silver metal film. Further, such a reflective coating covers the portions of plate 12/14 in contact with spacers 10, to prevent escape of luminescent radiation in such areas, as will be understood. Covering the cell is an essentially three-sided conduit 20 connected with inlet 22 and outlet 24.

Figure 8:
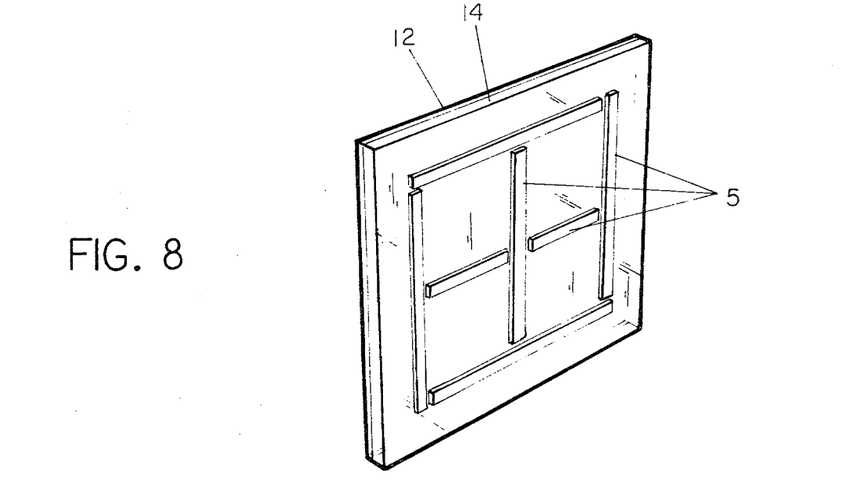
FIG. 8 is a perspective view of the bottom of the luminescent solar collector-concentrator plate of FIG. 7 showing the arrangement of photocells thereon.

In FIGS. 3, 5 and 6 a pattern of photovoltaic cells 5 (such as silicon photocells) are optically coupled in a regular repeating pattern on the bottom face of plate 12, as shown in the embodiment of FIG. 8. All four edges of plate 12/14 have a highly reflective coating, as described for the three sides in the description of FIGS. 1, 2 and 4, and also such a coating covers the parts of plate 12 in contact with spacers 10. This coating location is as shown at 9 in the description of FIG. 9.

In FIGS. 1-4 heat exchanger tubes 26 are welded or brazed to metal thermal collector plate 2. FIGS. 3, 5 and 6 are the same except for the heat transfer means for cooling the photocells and for recovery of heat generated from the photocells and from the thermal collector plate 2. In each, inlet conduit 28 and outlet conduit 30 are connected to space 6. Gaseous heat transfer fluid is conducted through such conduits 28 and 30 and through space 6 to cool the photocells 5 and to recover useful heat from both the photocells and from plate 2. Optionally, as in FIG. 3, heat transfer fluid, usually a liquid, is passed through heat transfer conduits 26 to recover useful heat from plate 2. Also optionally in FIG. 6 a heat transfer gas is passed through space 8 via inlet 32 and outlet 34 to pick up low grade thermal energy from plate 14, and outlet 34 can connect to inlet 28 for series flow. Although not shown, the cooling means of FIGS. 3, 5 and 6 can all be employed in the apparatus at once.

Figure 7:
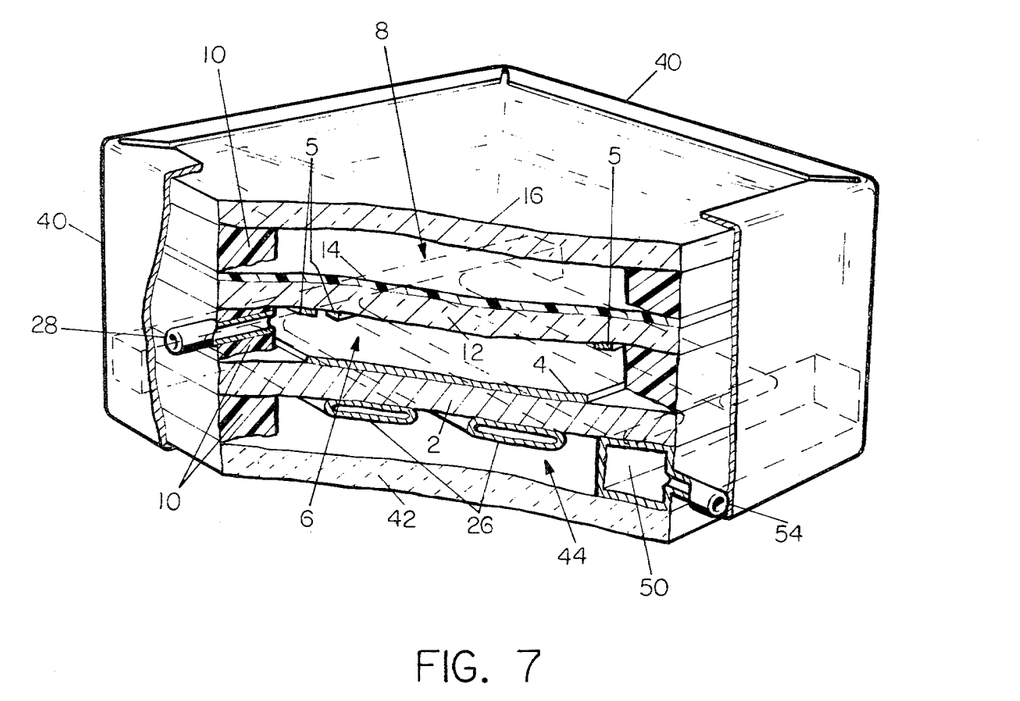
FIG. 7 is a perspective view of an embodiment of the apparatus, partly broken out and in cross-section.
Figure 10:
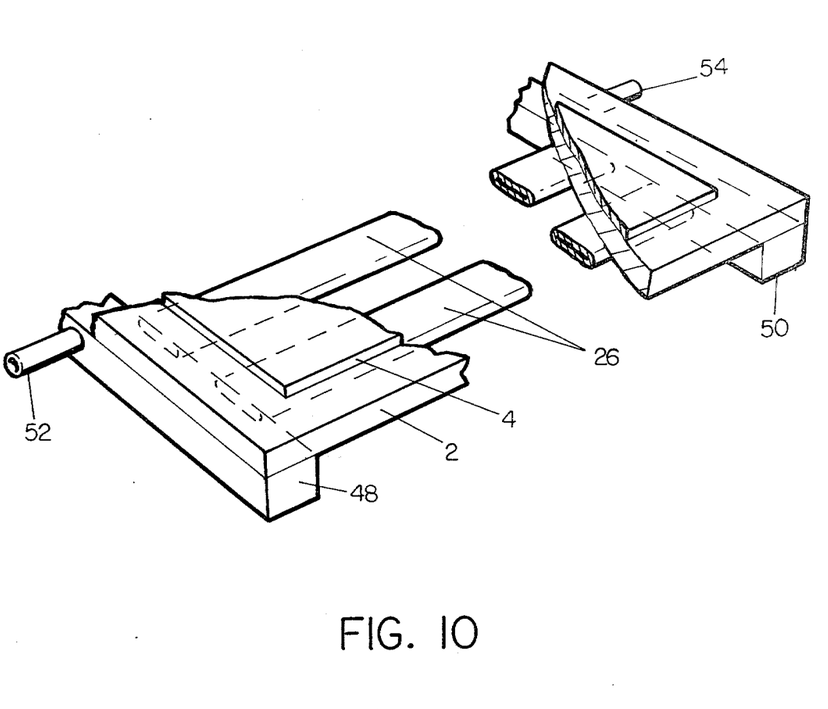
FIG. 10 shows the thermal collector plate and heat exchanger of FIG. 7.

Heat transfer fluid, usually liquid, is also passed through heat transfer conduits 26 in FIGS. 1, 2 and 4 to recover heat from plate 2. Heat transfer fluid, such as a gas, is passed through conduits 20 via inlets 22 and outlets 24 over photocells 18 to cool them and to recover useful heat therefrom. Heat transfer conduits 26 are illustrated in more detail in FIG. 10. While not shown, the bottom of plate 2 in each of FIGS. 1-6 is insulated from uncontrolled heat loss by an insulation space, as in FIGS. 7 and 11, or by being covered with an insulating solid such as, for instance, a closed cell plastic foam.

In FIGS. 1-6 when sunlight (or other light of visible and near-visible wave lengths) impinges on and passes into plate 12/14 a portion thereof activates the luminescent species in layer 14 of plate 12/14 to yield luminescent radiation. A major portion of said radiation is trapped by the process of total internal reflection and is largely coupled out to photocells 18 or 5, as the case may be, to produce electricity during which process a portion of the luminescent radiation absorbed by the cell is converted to heat and raises the temperature of the photocell. A portion of the sunlight, including visible wave lengths, is not absorbed by the luminescent species in layer 14, and this sunlight plus a minor portion of the luminescent radiation (the portion governed by Snell's law) passes through plate 12/14 and is absorbed and converted to heat by absorptively coated thermal collection plate 2. It will be noted that in each instance the photocells are coupled to the thick layer and are thus out of contact with the luminescent layer. Further, the luminescent layer is in every case enclosed in one of the protected spaces 6 or 8.

Figure 9:
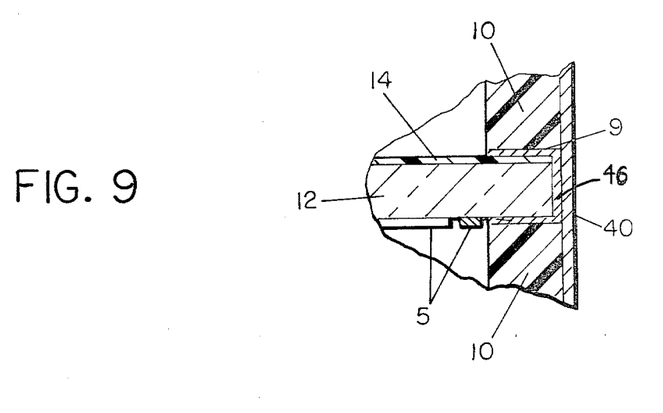
FIG. 9 is a detailed partial cross-section of FIG. 7 showing the join of the solar collector plate with the wall and spacers.

A structure of FIG. 3 is shown in more detail in FIGS. 7-10, wherein the same elements have the same numbers as in FIG. 3. In addition, metal frame 40 is crimped around the structure to compress spacers 10 and hold the assembly together. The edges of plate 12/14 and the face portions thereof that contact spacers 10 have a highly reflective coating 9 as shown in FIG. 9. Further, bottom plate 42 is of any suitable rigid material to provide insulation space 44. Further, the highly reflective surfaces 46 mentioned relative to FIG. 3 are specifically illustrated. Furthermore, it will be seen that conduits 26 connect with headers 48 and 50 which are connected respectively to inlet 52 and outlet 54.

Figure 11:
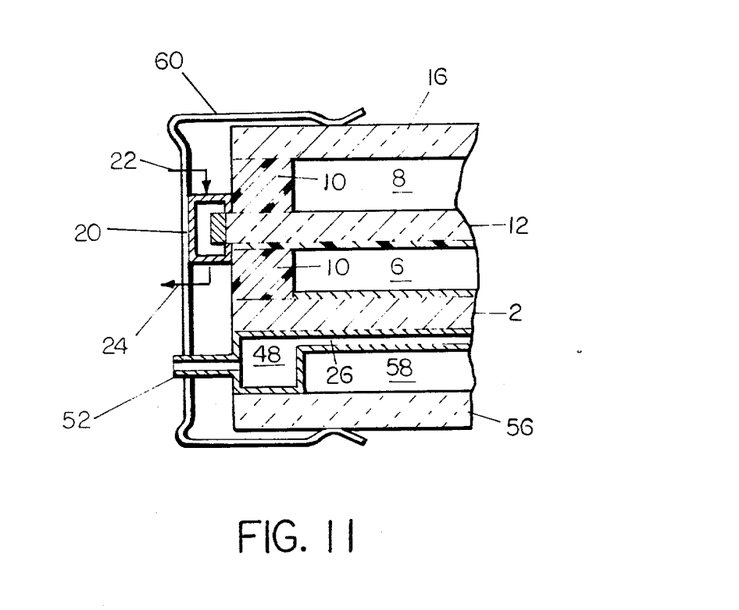
Figure 12:
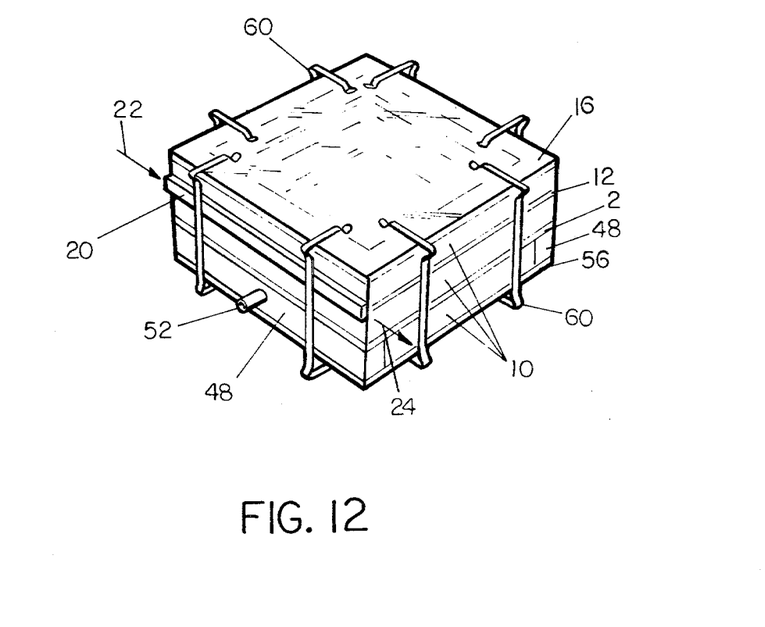
FIG. 12 is a perspective view of the apparatus of FIG. 11 showing the arrangement of the spring steel clamping means.

FIGS. 11 and 12 show a structure according to FIG. 2 in more detail. The same elements have the same numbers. Thermal collector plate 2 with welded or brazed tubes 26 is the same as in FIG. 10. Bottom plate 56 and the spacers 10 thereabove form insulating space below the thermal collector plate 2. Finally, the assembly is clamped together with spring steel clamps 60.

Plates 16 and 12 can be, for instance, glass or a clear plastic such as poly(methyl methacrylate), such as Plexiglas.

In a specific example according to FIGS. 3 and 7–10, plates 12 and 16 are 3 millimeter thick iron free borosilicate glass 60 cm. square, and thin layer 14 is made by diluting a 40 weight percent solution of poly(methyl methacrylate) in an 80:20 ratio of toluene to isopropyl alcohol (a commercial product of du Pont tradenamed Elvacite 6014) to an 8 weight percent solution of the polymer in more of the same solvent mixture. This solution is spray coated onto the outside of the glass plate 12. Before spraying, the polymer solution has added to it 0.15 grams of Coumarin 153 fluorescent dye for each 50 grams of the polymer. Enough coats are sprayed to make a coating 2 mils thick on the plate 12 after drying. Some of the same concentration polymer solution without the dye is painted on the surface of each of the silicon photovoltaic cells as a cement, and the photocells are then applied in the pattern shown in FIG. 8.

As exemplary luminescent materials or species useful in the present invention there can be mentioned by way of example fluorescent chelates and fluorescent dyes. Numerous specific dyes are known and available that absorb in different portions of the solar spectrum. These form no part of the present invention. It should also be mentioned that in the thin film luminescent layer 14, it is very advantageous and preferred that a given luminescent species used has absorption and emission spectra that overlap each other as little as possible, and they preferably do not measurably overlap. Dyes having this characteristic include, for instance, Coumarin 153, Coumarin 6 and Coumarin 151. Coumarin 153 is 1.2.4.5.3H.6H.10H. Tetrahydro-8-trifluoromethyl(1-)benzopyrano(9.9a.1-gh)quinolizin-10-one, Coumarin 6 is 3-(2-Benzothiazolyl)-7-N.N-diethylaminocoumarin, and Coumarin 151 is 7-Amino-4-trifluoromethylcoumarin.

Instead of using Coumarin 153 alone in the example of the invention structure given, it can be used together with Coumarin 6. The luminescent emission spectrum of the latter overlaps the absorption spectrum of Coumarin 153, and on exposure to sunlight the Coumarin 6 output activates the Coumarin 153.

As will be evident to those skilled in the art, various modifications of this invention can be made or followed in the light of the foregoing disclosure and discussion without departing from the spirit and scope of the disclosure or from the scope of the claims.

We claim:

1. In a flat form solar collector, for collecting and absorbing solar radiation and conversion of said radiation to heat, comprising (1) a flat thermal collector plate having an upper surface that has a high absorptivity, at least 0.8, for electromagnetic radiation of wave lengths of 0.3 to 2.1 microns and converts such radiation on absorption largely to heat and (2) one or two superimposed enclosed insulating spaces above said thermal collector plate, each space being defined by a light conducting plate, the whole being sealed or enclosed about the periphery to form one or two spaces above said thermal plate isolated from the ambient atmosphere, the improvement wherein at least the light conducting plate immediately above said thermal collector plate is a luminescent solar collector and concentrator plate comprising a radiation collection medium for receiving incident solar radiation, wherein said radiation collection medium is a composite structure comprising:
   (a) a thin layer, containing at least one luminescent species capable of emitting luminescent radiation upon excitation with incident solar radiation, optically and physically coupled to
   (b) a relatively thick radiation conducting layer having an index of refraction close to that of said thin layer, said radiation collection medium being (i) totally internally reflective of a major portion of said emitted luminescent radiation, (ii) transparent to a portion of said incident solar radiation including visible wavelengths and (iii) optically coupled, in a relatively small portion of the surface area of said thick layer, to a photovoltaic cell responsive to said emitted luminescent radiation,
said thin layer containing said luminescent species being within one of said enclosed insulating spaces,
   whereby in operation a portion of said luminescent radiation is conducted to said solar cell to produce electricity, and unabsorbed solar radiation including visible wavelengths plus a minor portion of said luminescent radiation is transmitted to said thermal collector plate and largely converted to heat, and
   whereby said thin layer is protected from the ambient environment and from direct contact with said solar cell.

2. An improvement according to claim 1 wherein said thin layer of said luminescent solar collector and concentrator plate faces said upper surface of said thermal collector plate, and wherein said photovoltaic cell is located on a peripheral outwardly facing edge of said solar collector plate.

3. An improvement according to claim 2 wherein said thermal collector plate has means for recovering heat therefrom by conduction through the bottom thereof to a heat transfer fluid.

4. An improvement according to claim 3 including means to pass heat transfer fluid into heat exchange contact with said solar cell to recover heat from said solar cell and to cool said solar cell.

5. An improvement according to claim 4 including means to pass the heat transfer fluid after heating by said solar cell into heat transfer contact with the bottom of said thermal collector plate to recover heat from said thermal collector plate.

6. An improvement according to claim 1 wherein there are two superimposed closed insulating spaces above said thermal collector plate.

7. An improvement according to claim 6 wherein said thin layer of said luminescent solar collector and concentrator plate is on the top side, and wherein said photovoltaic cell is located on a peripheral outwardly facing edge of said solar collector plate.

8. An improvement according to claim 7 wherein said thermal collector plate has means for recovering heat therefrom by conduction through the bottom thereof to a heat transfer fluid.

9. An improvement according to claim 8 including means to pass heat transfer fluid into heat exchange contact with said solar cell to recover heat from said solar cell and to cool said solar cell.

10. An improvement according to claim 9 including means to pass the heat transfer fluid after heating by said solar cell into heat transfer contact with the bottom of said thermal collector plate to recover heat from said thermal collector plate.

11. An improvement according to claim 6 wherein said thin layer of said luminescent solar collector and concentrator plate is on the top side of said solar collector plate which is immediately above said thermal collector plate, and a pattern of photovoltaic cells is physically and optically attached to the bottom of said luminescent solar collector plate.

12. An apparatus according to claim 11 including means for introducing gaseous heat transfer fluid into the space between said thermal collector plate and said luminescent solar collector plate and means for passing such gas heated by said photovoltaic cells and said thermal collector plate from said space for recovery of the heat therefrom.

13. An improvement according to claim 12 including means for recovering heat from said thermal collector plate by conduction through the bottom thereof to a heat transfer fluid.

14. An improvement according to claim 12 including means for effecting heat transfer from the bottom of the thermal collector plate to the heated gaseous fluid after it exits from the space between the thermal collector plate and the luminescent solar collector plate.

* * * * *